US010640871B2

(12) United States Patent
Takenaga et al.

(10) Patent No.: US 10,640,871 B2
(45) Date of Patent: May 5, 2020

(54) HEAT TREATMENT SYSTEM, HEAT TREATMENT METHOD, AND PROGRAM

(71) Applicant: Tokyo Electron Limited, Tokyo (JP)

(72) Inventors: Yuichi Takenaga, Iwate (JP); Hiroichi Ota, Iwate (JP); Shingo Sekisawa, Iwate (JP)

(73) Assignee: TOKYO ELECTRON LIMITED, Tokyo (JP)

(*) Notice: Subject to any disclaimer, the term of this patent is extended or adjusted under 35 U.S.C. 154(b) by 878 days.

(21) Appl. No.: 15/050,006

(22) Filed: Feb. 22, 2016

(65) Prior Publication Data

US 2016/0244881 A1    Aug. 25, 2016

(30) Foreign Application Priority Data

Feb. 24, 2015 (JP) ................. 2015-033722

(51) Int. Cl.
| C23C 16/52 | (2006.01) |
|---|---|
| C23C 16/46 | (2006.01) |
| H01L 21/67 | (2006.01) |
| C23C 16/458 | (2006.01) |
| C23C 16/455 | (2006.01) |

(52) U.S. Cl.
CPC .......... *C23C 16/52* (2013.01); *C23C 16/4583* (2013.01); *C23C 16/45578* (2013.01); *C23C 16/46* (2013.01); *H01L 21/67109* (2013.01)

(58) Field of Classification Search
CPC .............. C23C 16/52; C23C 16/45578; C23C 16/4583; C23C 16/46; H01L 21/67109
USPC .......................................................... 118/715
See application file for complete search history.

(56) References Cited

U.S. PATENT DOCUMENTS

| 2006/0094248 A1* | 5/2006 | Nishita | H01L 21/02233 |
|---|---|---|---|
| | | | 438/758 |
| 2009/0232967 A1* | 9/2009 | Takenaga | C23C 16/402 |
| | | | 427/9 |
| 2013/0260039 A1* | 10/2013 | Takenaga | B05D 3/0218 |
| | | | 427/314 |

FOREIGN PATENT DOCUMENTS

| JP | 2005-183596 A | 7/2005 |
|---|---|---|
| JP | 2009-260261 A | 11/2009 |
| JP | 2009-260262 A | 11/2009 |
| JP | 2013-207109 A | 10/2013 |
| JP | 2013-207110 A | 10/2013 |
| JP | 2013-207255 A | 10/2013 |
| JP | 2013-207256 A | 10/2013 |

(Continued)

*Primary Examiner* — Aiden Lee
(74) *Attorney, Agent, or Firm* — Abelman, Frayne & Schwab

(57) ABSTRACT

A heat treatment system includes a heating unit that heats an inside of a processing chamber in which a plurality of workpieces are accommodated; a heat treatment condition storing unit that stores a heat treatment condition; a heat treatment change model storing unit that stores a heat treatment change model; a heat treatment performing unit that performs the heat treatment condition; a heat treatment result receiving unit that receives a result of heat treatment performed; and an optimum temperature calculating unit that calculate a target heat treatment result for an in-plane shape of the workpiece based on a target heat treatment result and information about a shape of the target heat treatment result, and calculate an optimum temperature that results in the target heat treatment result, based on the calculated target heat treatment result and the heat treatment change model.

10 Claims, 10 Drawing Sheets

(56) References Cited

FOREIGN PATENT DOCUMENTS

| JP | 2014-220430 A | 11/2014 |
|----|---------------|---------|
| JP | 2015-015315 A | 1/2015 |
| JP | 2015-018879 A | 1/2015 |
| JP | 2015-179752 A | 10/2015 |

* cited by examiner

FIG.4

|  | TEMPERATURE (INCREASE BY 1°C) | | | | |
|---|---|---|---|---|---|
|  | ZONE1 | ZONE2 | ZONE3 | ZONE4 | ZONE5 |
| FILM THICKNESS (nm) ZONE1 | 2.00 | −0.70 | 0.80 | −0.04 | 0.00 |
| ZONE2 | −0.70 | 2.00 | −0.70 | 0.70 | 0.02 |
| ZONE3 | 0.80 | −0.70 | 2.00 | −0.70 | 0.70 |
| ZONE4 | −0.05 | 0.80 | −0.70 | 2.00 | −0.70 |
| ZONE5 | 0.00 | −0.05 | 0.80 | −0.70 | 2.00 |

FIG.5

|  | TARGET FILM THICKNESS OF CENTER (nm) | TARGET FILM THICKNESS OF EDGE (nm) |
|---|---|---|
| ZONE1 | 68.0 | 62.0 |
| ZONE2 | 68.0 | 62.0 |
| ZONE3 | 68.0 | 62.0 |
| ZONE4 | 68.0 | 62.0 |
| ZONE5 | 68.0 | 62.0 |

FIG.7

|  | TEMPERATURE (°C) |
|---|---|
| ZONE1 | 580.0 |
| ZONE2 | 580.0 |
| ZONE3 | 580.0 |
| ZONE4 | 580.0 |
| ZONE5 | 580.0 |

FIG.8

|  | TEMPERATURE (°C) |
|---|---|
| ZONE1 | 581.0 |
| ZONE2 | 580.9 |
| ZONE3 | 579.7 |
| ZONE4 | 581.6 |
| ZONE5 | 579.9 |

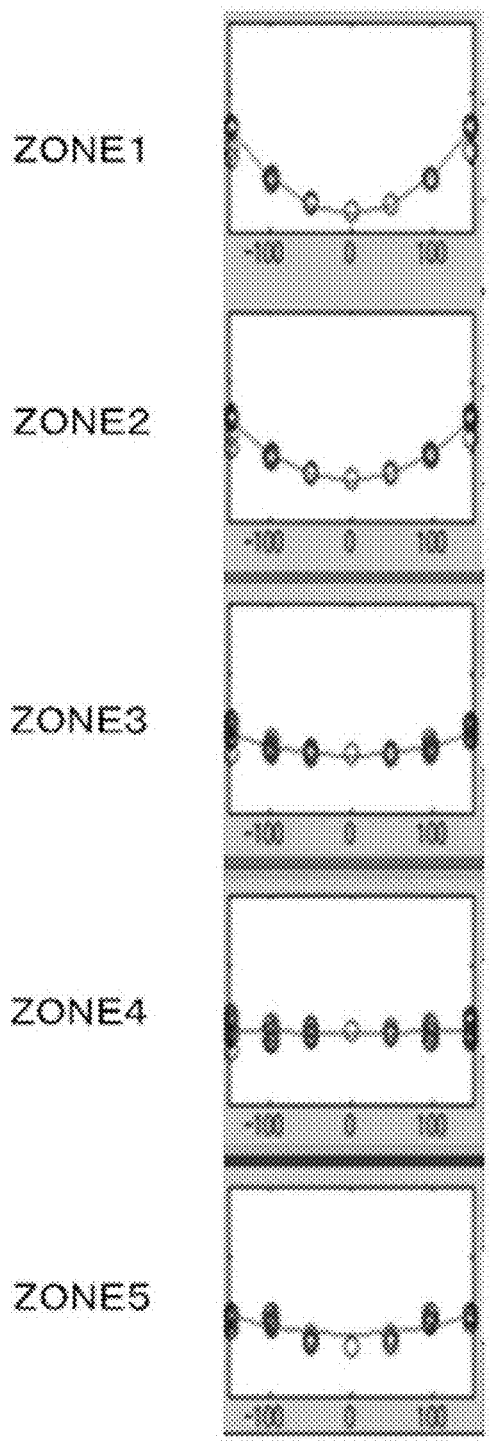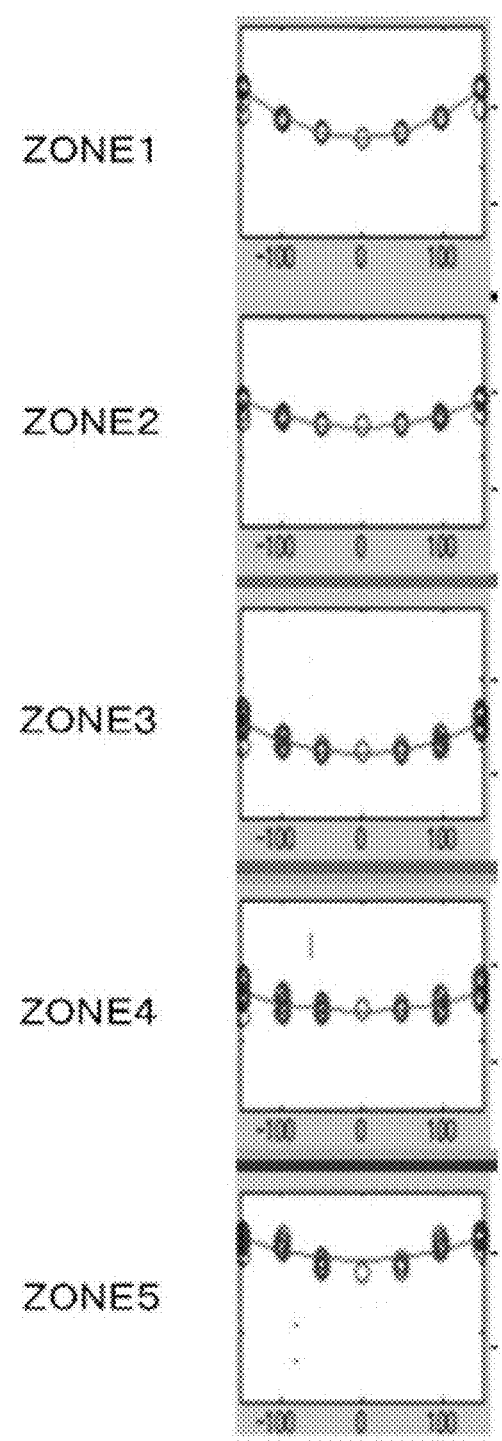
*FIG.9A*  *FIG.9B*

FIG.10A

|  | TARGET FILM THICKNESS (nm) | TARGET SHAPE (CONCAVE, CONVEX, FLAT) | IN-PLANE RANGE (±%) |
|---|---|---|---|
| ZONE1 | 62.0 | convex | 2.0 |
| ZONE2 | 61.0 | convex | 1.9 |
| ZONE3 | 60.0 | convex | 1.8 |
| ZONE4 | 59.0 | convex | 1.7 |
| ZONE5 | 58.0 | convex | 1.6 |

FIG.10B

|  | TARGET FILM THICKNESS (nm) | TARGET SHAPE (CONCAVE, CONVEX, FLAT) | IN-PLANE RANGE (±%) |
|---|---|---|---|
| ZONE1 | 62.0 | convex | 2.0 |
| ZONE2 | 61.0 | convex | 1.9 |
| ZONE3 | 60.0 | convex | 1.8 |
| ZONE4 | 59.0 | convex | 1.7 |
| ZONE5 | 58.0 | convex | 1.6 |

FIG.10C

|  | TARGET FILM THICKNESS (nm) | TARGET SHAPE (CONCAVE, CONVEX, FLAT) | IN-PLANE RANGE (±%) |
|---|---|---|---|
| ZONE1 | 62.0 | convex | 3.2 |
| ZONE2 | 62.0 | convex | 3.2 |
| ZONE3 | 62.0 | convex | 3.2 |
| ZONE4 | 62.0 | convex | 3.2 |
| ZONE5 | 62.0 | convex | 3.2 |

HEAT TREATMENT SYSTEM, HEAT TREATMENT METHOD, AND PROGRAM

CROSS-REFERENCE TO RELATED APPLICATIONS

This application is based on and claims priority from Japanese Patent Application No. 2015-033722 filed on Feb. 24, 2015 with the Japan Patent Office, the disclosure of which is incorporated herein in its entirety by reference.

TECHNICAL FIELD

The present disclosure relates to a heat treatment system, a heat treatment method, and a program for heat-treating a workpiece such as, for example, a semiconductor wafer, particularly, a batch-type heat treatment system, a batch-type heat treatment method, and a program for collectively processing a plurality of workpieces.

BACKGROUND

In a semiconductor device manufacturing process, a batch type heat treatment system has been used to collectively perform a film formation processing, an oxidation processing, a diffusion processing, and the like on a plurality of workpieces such as, for example, semiconductor wafers. In the batch type heat treatment system, the semiconductor wafers may be efficiently processed. However, it is difficult to ensure uniformity of the heat treatment of the plurality of semiconductor wafers.

In order to solve the problem, for example, Japanese Patent Laid-Open Publication No. 2005-183596 has proposed a heat treatment apparatus for automatically adjusting a temperature of an external air taken into a heater chamber to be constant.

SUMMARY

According to a first aspect, the present disclosure provides a heat treatment system including: a heating unit configured to heat an inside of a processing chamber in which a plurality of workpieces are accommodated; a heat treatment condition storing unit configured to store a heat treatment condition according to a heat treatment content, including a temperature in the processing chamber heated by the heating unit; a heat treatment change model storing unit configured to store a heat treatment change model that represents a relationship between a change of a temperature in the processing chamber and a change of a heat treatment result; a heat treatment performing unit configured to perform the heat treatment condition stored by the heat treatment condition storing unit; a heat treatment result receiving unit configured to receive a result of a heat treatment performed by the heat treatment performing unit; and an optimum temperature calculating unit configured to calculate a target heat treatment result for an in-plane shape of the workpiece, based on a target heat treatment result and information about a shape of the target heat treatment result, and calculate an optimum temperature that results in the target heat treatment result, based on the calculated target heat treatment result for the in-plane shape and the heat treatment change model stored in the heat treatment change model storing unit.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 4 is an exemplary film thickness change model representing a relationship between a change in temperature of a heater and a change in film thickness of a $SiO_2$ film to be formed.

FIG. 5 is a view illustrating target film thicknesses input by an operator.

FIG. 7 is a view illustrating temperatures stored in a recipe.

FIG. 8 is a view illustrating calculated set temperatures.

FIGS. 9A and 8B are views for confirming the effects of the present disclosure.

FIGS. 10A to 10C are views illustrating target film thicknesses input by an operator in another exemplary embodiment.

DETAILED DESCRIPTION

Figure 1:
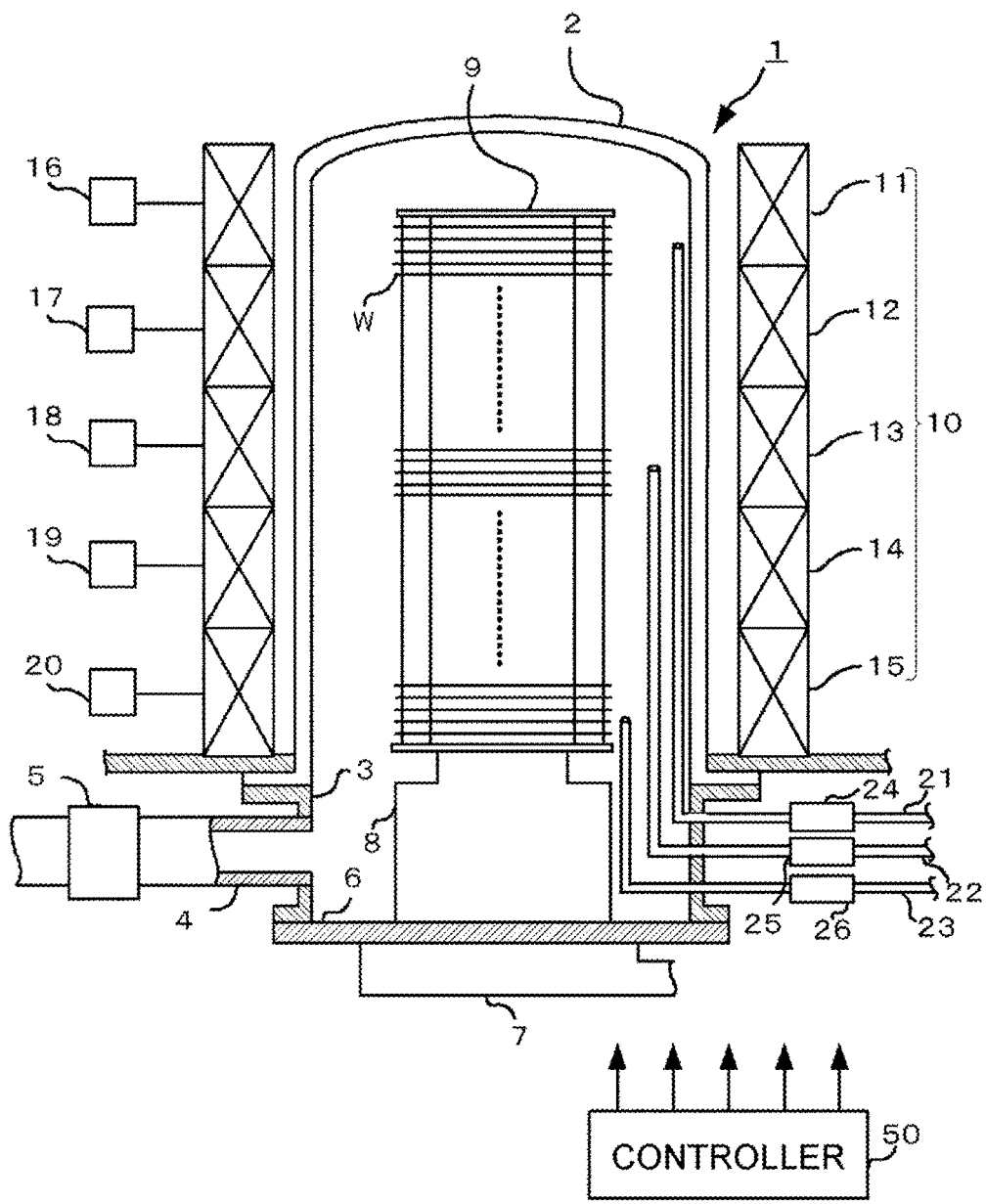
FIG. 1 is a view illustrating a structure of a heat treatment apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

With the recent miniaturization, required specifications for uniformity become stricter, and further improvement of in-plane uniformity of the semiconductor wafer is required. Further, in a mask forming process, the in-plane shape of the semiconductor wafer is required to be aligned concavely. In addition, in setting a process condition using a semiconductor wafer without a pattern, the in-plane shape of the semiconductor wafer is required to be aligned convexly. Thus, a heat treatment system and a heat treatment method are required, which can control the in-plane shape of the semiconductor wafer.

The present disclosure has been made in consideration of the above circumstance, and an object of the present disclosure is to provide a heat treatment system, a heat treatment method, and a program, which can control the in-plane shape of the workpiece.

According to a first aspect, the present disclosure provides a heat treatment system including: a heating unit configured to heat an inside of a processing chamber in which a plurality of workpieces are accommodated; a heat treatment condition storing unit configured to store a heat treatment condition according to a heat treatment content, including a temperature in the processing chamber heated by the heating unit; a heat treatment change model storing unit configured to store a heat treatment change model that represents a relationship between a change of a temperature in the processing chamber and a change of a heat treatment result; a heat treatment performing unit configured to perform the heat treatment condition stored by the heat treatment condition storing unit; a heat treatment result receiving unit configured to receive a result of a heat treatment performed by the heat treatment performing unit; and an optimum temperature calculating unit configured to calculate a target heat treatment result for an in-plane shape of the workpiece, based on a target heat treatment result and information about a shape of the target heat treatment result, and calculate an optimum temperature that results in the target heat treatment result, based on the calculated target heat treatment result for the in-plane shape and the heat treatment change model stored in the heat treatment change model storing unit.

The optimum temperature calculating unit calculates the target heat treatment result for the in-plane shape of the workpiece, based on a target heat treatment result in a center portion and an edge portion of the workpiece and the information about the shape of the target heat treatment result, and calculate the optimum temperature that results in the target heat treatment result, based on the calculated target heat treatment result and the heat treatment change model stored in the heat treatment change model storing unit.

For example, the processing chamber is divided into a plurality of zones. The heating unit sets a temperature for each of the zones in the processing chamber. The heat treatment condition stored in the heat treatment condition storing unit is set for each of the zones in the processing chamber. The heat treatment change model stored in the heat treatment change model storing unit represents a relationship between a change of a temperature in the processing chamber for each of the zones and a change of a heat treatment result for each of the zones. The optimum temperature calculating unit calculates an optimum temperature for each of the zones.

For example, the heat treatment content is a film formation processing, and the heat treatment result is a film thickness of a thin film formed on the workpiece.

According to a second aspect, the present disclosure provides a heat treatment method including: heating an inside of a processing chamber in which a plurality of workpieces are accommodated; storing a heat treatment condition according to a heat treatment content, including a temperature in the processing chamber heated by the heating; storing a heat treatment change model that represents a relationship between a change of a temperature in the processing chamber and a change of a heat treatment result; performing the heat treatment condition stored in the storing of the heat treatment condition; receiving a result of a heat treatment performed by the heat treatment performing unit; and calculating a target heat treatment result for an in-plane shape of the workpiece, based on a target heat treatment result and information about a shape of the target heat treatment result, and calculating an optimum temperature that results in the target heat treatment result, based on the calculated target heat treatment result for the in-plane shape and the heat treatment change model stored in the heat treatment change model storing unit.

According to a third aspect, the present disclosure provides a non-transitory computer-readable storage medium that stores a program which, when executed, causes a computer to function as a heating unit configured to heat an inside of a processing chamber in which a plurality of workpieces are accommodated; a heat treatment condition storing unit configured to store a heat treatment condition according to a heat treatment content, including a temperature in the processing chamber heated by the heating unit; a heat treatment change model storing unit configured to store a heat treatment change model that represents a relationship between a change of a temperature in the processing chamber and a change of a heat treatment result; a heat treatment performing unit configured to perform the heat treatment condition stored by the heat treatment condition storing unit; a heat treatment result receiving unit configured to receive a result of the heat treatment performed by the heat treatment performing unit; and an optimum temperature calculating unit configured to calculate a target heat treatment result for an in-plane shape of the workpiece, based on a target heat treatment result and information about a shape of the target heat treatment result, and calculate an optimum temperature that results in the target heat treatment result, based on the calculated target heat treatment result for the in-plane shape and the heat treatment change model stored in the heat treatment change model storing unit.

According to the present disclosure, the in-plane shape of the workpiece may be controlled.

Hereinafter, the present exemplary embodiment will be described with respect to a case where the heat treatment system, the heat treatment method, and the program of the present invention are applied to a batch type vertical heat treatment apparatus illustrated in FIG. 1. Further, in the exemplary embodiment, the present disclosure will be described with respect to a case where a $SiO_2$ film is formed on a semiconductor wafer by using dichlorosilane ($SiH_2Cl_2$) and dinitrogen monoxide ($N_2O$) as film forming gases.

As illustrated in FIG. 1, a heat treatment apparatus 1 includes a substantially cylindrical reaction tube 2 having a ceiling. The reaction tube 2 is arranged such that its length direction is oriented in the vertical direction. The reaction tube 2 is formed of a material that is excellent in heat resistance and corrosion resistance, for example, quartz.

A substantially cylindrical manifold 3 is provided at a lower side of the reaction tube 2. The upper end of the manifold 3 is hermetically joined to the lower end of the reaction tube 2. The manifold 3 is hermetically connected to an exhaust pipe 4 to exhaust gas in the reaction tube 2. The exhaust pipe 4 is provided with a pressure adjusting unit 5 such as, for example, a valve or a vacuum pump, and adjusts the inside of the reaction tube 2 to a desired pressure (degree of vacuum).

A cover 6 is provided at a lower side of the manifold 3 (reaction tube 2). The cover 6 is configured to be movable up and down by a boat elevator 7. Thus, the cover 6 is disposed such that, when the cover 6 is moved up by the boat elevator 7, the lower side (furnace opening portion) of the manifold 3 (reaction tube 2) is closed, and when the cover 6 is moved down by the boat elevator 7, the lower side (furnace opening portion) of the manifold 3 (reaction tube 2) is opened.

A wafer boat 9 is provided above the cover 8 through a heat insulating cylinder (heat insulator) 8. The wafer boat 9 is a wafer holder that accommodates (holds) workpieces, for example, semiconductor wafers W. In the present exemplary embodiment, the wafer boat 9 is configured to accommodate a plurality (e.g., 150 sheets) of semiconductor wafers W at predetermined intervals in the vertical direction. Then, the semiconductor wafers W are accommodated in the wafer boat 9, and the cover 9 is moved up by the boat elevator 7, so that the semiconductor wafers W are loaded into the reaction tube 2.

Figure 3:
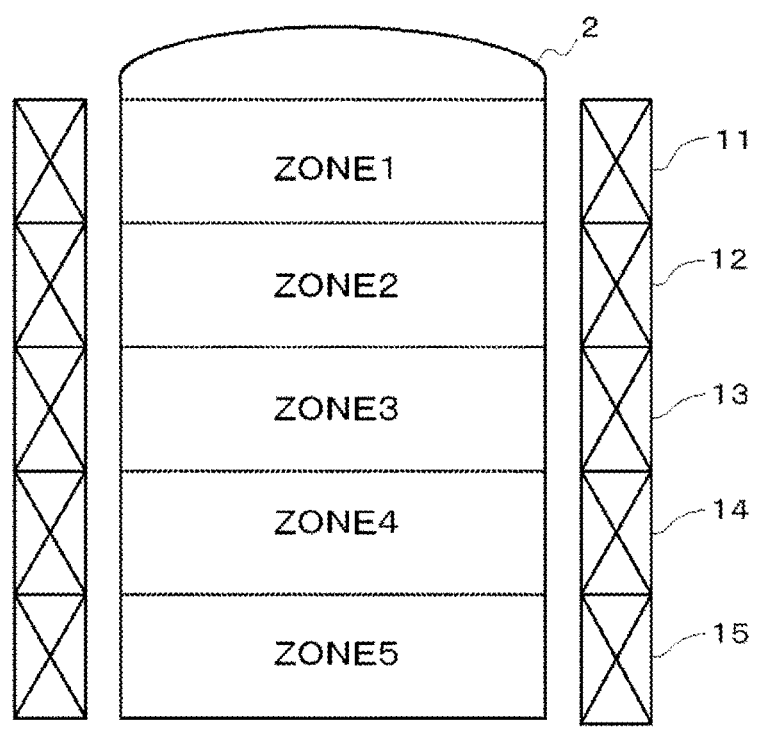
FIG. 3 is a view illustrating zones in a reaction tube.

A heater unit 10 including, for example, resistance heating elements is provided around the reaction tube 2 to surround the reaction tube 2. The inside of the reaction tube 2 is heated to a predetermined temperature by the heater unit 10. As a result, the semiconductor wafers W are heated to a predetermined temperature. The heater unit 10 is constituted by, for example, heaters 11 to 15 arranged in five tiers. The heaters 11 to 15 are connected to power controllers 16 to 20, respectively. Therefore, since power is independently supplied to each of the power controllers 16 to 20, each of the heaters 11 to 15 may be independently heated to a desired temperature. As described above, the inside of the reaction tube 2 is divided into five zones as illustrated in FIG. 3, by the heaters 11 to 15. For example, when the top (ZONE 1) in the reaction tube 2 is heated, the power controller 16 is controlled to heat the heater 11 to a desired temperature. When the center (ZONE 3) in the reaction tube 2 is heated, the power controller 18 is controlled to heat the heater 13 to a desired temperature. When the bottom (ZONE 5) in the reaction tube 2 is heated, the power controller 20 is controlled to heat the heater 15 to a desired temperature.

Further, the manifold 3 is provided with a plurality of processing gas supply pipes to supply a processing gas into the reaction tube 2. FIG. 1 illustrates three processing gas supply pipes 21 to 23 to supply the processing gas to the manifold 3. The processing gas supply pipe 21 is formed to extend from the side of the manifold 3 to the vicinity of the top of the wafer boat 9 (ZONE 1). The processing gas supply pipe 22 is formed to extend from the side of the manifold 3 to the vicinity of the center of the wafer boat 9 (ZONE 3). The processing gas supply pipe 23 is formed to extend from the side of the manifold 3 to the vicinity of the bottom of the wafer boat 9 (ZONE 5).

The processing gas supply pipes 21 to 23 are provided with flow rate adjusting units 24 to 26, respectively. Each of the flow rate adjusting units 24 to 26 is constituted by, for example, a mass flow controller (MFC) to adjust the flow rate of the processing gas flowing through the processing gas supply pipes 21 to 23. Thus, the processing gas supplied from each of the processing gas supply pipes 21 to 23 is adjusted to a desired flow rate by each of the flow rate adjusting units 24 to 26, and then, supplied into the reaction tube 2.

Figure 2:
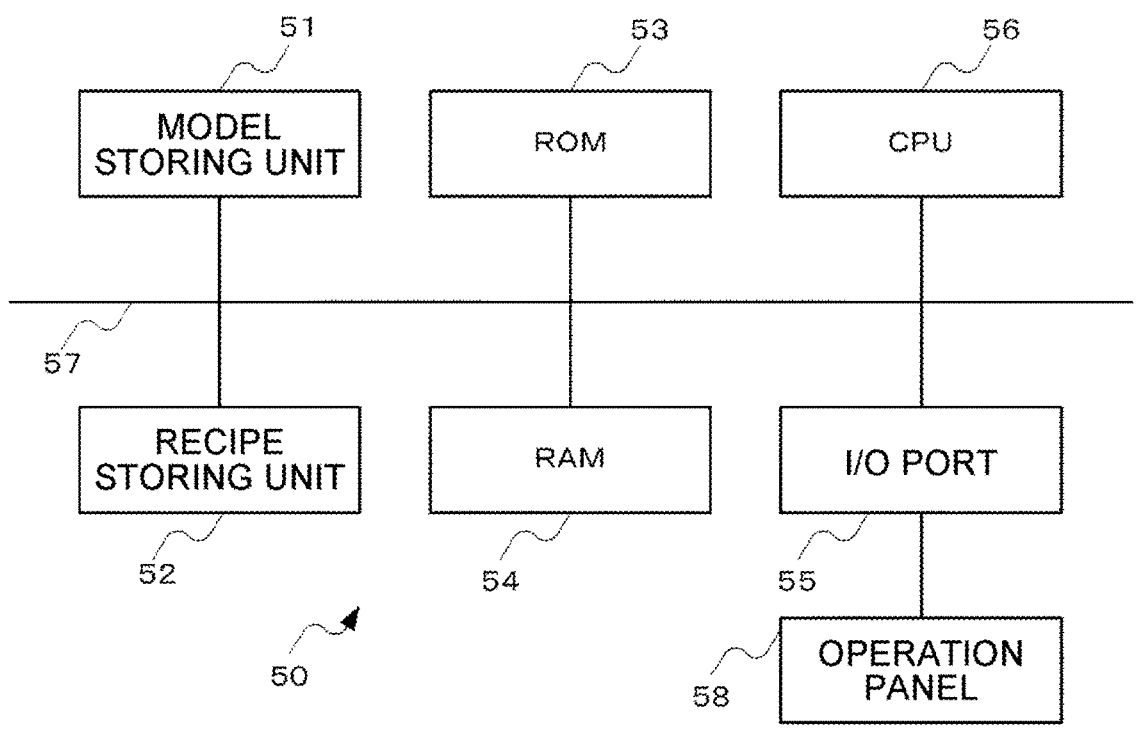
FIG. 2 is a view illustrating an exemplary configuration of the controller in FIG. 1.

Further, the heat treatment apparatus 1 includes a controller 50 configured to control processing parameters such as, for example, a gas flow rate, a pressure, and a temperature of the processing atmosphere in the reaction tube 2. The controller 50 outputs a control signal to, for example, the flow rate controlling units 24 to 26, the pressure adjusting unit 5, or the power controllers 16 to 20 of the heaters 11 to 15. FIG. 2 illustrates the configuration of the controller 50.

As illustrated in FIG. 2, the controller 50 includes a model storing unit 51, a recipe storing unit 52, a read only memory (ROM) 53, a random access memory (RAM) 54, an input/output (I/O) port 55, a central processing unit 56, and a bus 57 that connects these components with each other.

The model storing unit 51 stores a film thickness change model representing a relationship between a change in temperature of a heater and a change in film thickness of a $SiO_2$ film to be formed. FIG. 4 illustrates an exemplary film thickness change model. As illustrated in FIG. 4, the film thickness change model exhibits how much the film thickness of a $SiO_2$ film formed in each zone is changed when the temperature of a predetermined zone is increased by 1° C. For example, as illustrated in FIG. 4, when a temperature set value of ZONE 1 is increased by 1° C. by controlling the power controller 16 to heat the heater 11, the film thickness of the $SiO_2$ film formed in ZONE 1 is increased by 2 nm, the film thickness of the $SiO_2$ film formed in ZONE 2 is decreased by 0.7 nm, the film thickness of the $SiO_2$ film formed in ZONE 3 is increased by 0.8 nm, and the film thickness of the $SiO_2$ film formed in ZONE 4 is decreased by 0.05 nm.

Further, the film thickness change model may be satisfactory as long as it exhibits how much the film thickness of a $SiO_2$ film formed in each zone is changed when the temperature of a predetermined zone is changed, but many other models may also be used. Further, in the models, since a non-optimal numerical value of the default is also considered depending on the process conditions or the state of the equipment, a learning function may be loaded by adding, for example, an expansion Kalman filter to software, so as to perform learning of the models. As for the learning function by the expansion Kalman filter, a method disclosed in, for example, U.S. Pat. No. 5,991,525 may be used.

In addition, in a case where an in-plane shape of a target semiconductor wafer W is in an uneven concave or convex form, the model storing unit 51 stores a conversion equation (conversion coefficient) for converting the concave or convex from. The conversion equation is an equation for converting a measured film thickness into a film thickness that is made intentionally different from the measured film thickness in order to form an unevenness shape in the plane, and is expressed by, for example, the following equation:

Film thickness after conversion=Film thickness before conversion×Conversion coefficient The conversion coefficient is expressed by, for example, the following equation:

Conversion coefficient=Target film thickness in a semiconductor wafer with a pattern/Target film thickness in a semiconductor wafer without a pattern In the present exemplary embodiment, as described later, a secondary approximate expression is obtained from an input film thickness and input coordinates that are input, by the least square method. An approximate film thickness of each input point is calculated from the obtained secondary approximate expression. From the approximate film thickness at each input point, the film thickness after conversion is calculated by the following equation:

Film thickness after conversion=Approximate film thickness at each input point×(Target film thickness for each slot and position/Target film thickness in recipe)

The recipe storing unit 52 stores a process recipe that determines a control procedure depending on the kind of the film formation processing to be performed in the heat treatment apparatus 1. The process recipe is a recipe prepared for every processing (process) actually performed by a user, and defines the temperature change of each unit, the pressure change within the reaction tube 2, the timings of the start of the supply of the gas and the stop of the supply, and the supply amount, from the loading of the semiconductor wafers W onto the reaction tube 2 to the unloading of the processed semiconductor wafers therefrom.

The ROM 53 is a storage medium that is constituted by, for example, an electrically erasable programmable read-only memory (EEPROM), a flash memory, or a hard disc, and stores an operation program of the CPU 56.

The RAM 54 functions as, for example, a work area of the CPU 56.

The I/O port 55 supplies a measurement signal for a temperature, a pressure, or a gas flow rate, and outputs a control signal output by the CPU 56 to the respective units (e.g., the pressure adjusting unit 5, the power controllers 16 to 20 of the heaters 11 to 15, and the flow rate controlling units 24 to 26). Further, the I/O port 55 is connected with an operation panel 58 with which an operator operates the heat treatment apparatus 1.

The CPU 56 constitutes the core of the controller 50. The CPU 56 executes the operation program stored in the ROM 53, and according to the instructions from the operation panel 58, controls the operations of the heat treatment apparatus 1 along the process recipe stored in the recipe storing unit 52.

The CPU 56 calculates a set temperature of each of the heaters 11 to 15 disposed in each zone (ZONES 1 to 5) in the reaction tube 2 where the target film thickness is formed, based on the film thickness change model stored in the model storing unit 51 and the film thickness of the formed SiO$_2$ film. Further, the CPU 56 converts a measured film thickness into a film thickness that is made intentionally different therefrom in order to form an unevenness shape in the plane.

The bus 57 transmits information between the respective units.

Figure 6:
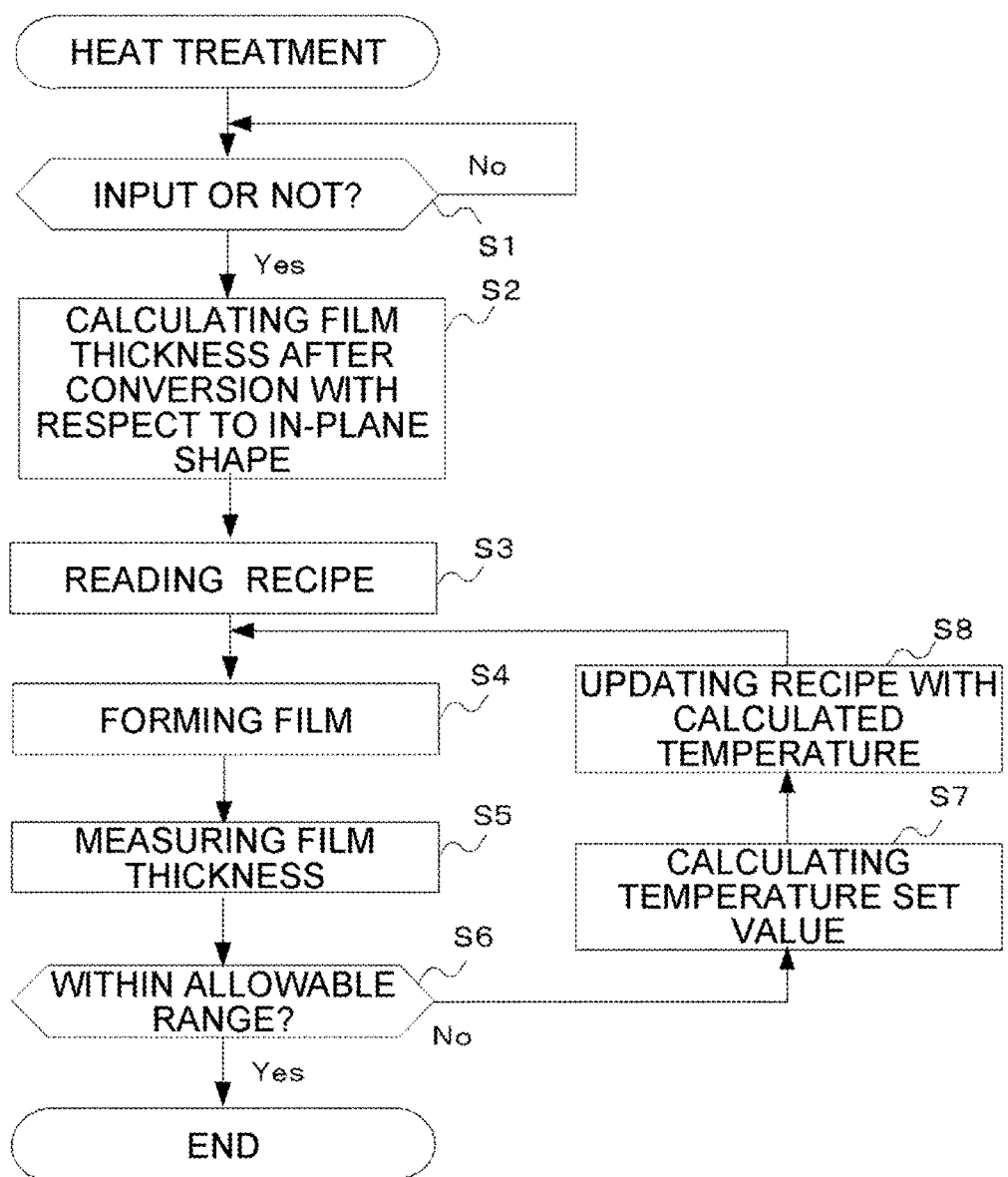
FIG. 6 is a flowchart for explaining a heat treatment.

Next, descriptions will be made on a heat treatment method using the heat treatment apparatus 1 configured as described above. In the heat treatment of the present exemplary embodiment, an operator operates the operation panel 58 to select a process type (in this exemplary embodiment, a film formation of the SiO$_2$ film with dichlorosilane and dinitrogen monoxide (N$_2$O) (DCS-HTO)), and input a target film thickness of the center of the semiconductor wafer and a target film thickness of the edge thereof with respect to a film thickness of the SiO$_2$ film to be targeted. FIG. 6 is a flowchart for explaining the heat treatment of the present exemplary embodiment.

First, the controller 50 (CPU 56) determines whether the required information (e.g., the process type) is input (step S1). When it is determined that the required information is input (step S1; Yes), the CPU 56 calculates a film thickness after the conversion with respect to the in-plane shape of each semiconductor wafer W, based on the input target film thicknesses of the center and the edge of the SiO$_2$ film (step S2).

For example, the CPU 56 first obtains a secondary approximate curve from the input target film thicknesses and the coordinates thereof based on the conversion equation stored in the model storing unit 51. For example, the secondary approximate expression, film thickness of each input point=a×(distance from center of semiconductor wafer W)$^2$+b, is obtained by the least square method.

Then, the CPU 56 calculates an approximate film thickness of each input point from the obtained secondary approximate expression. Subsequently, the CPU 56 calculates the film thickness after conversion from the approximate film thickness at each input point by the following equation:

Film thickness after conversion=Approximate film thickness at each input point×(Target film thickness for each slot and position/Target film thickness in recipe)

Here, the target film thickness for each slot and position is the input target film thickness of the center or the edge which is an average film thickness of the target film thicknesses in the recipe.

Further, the CPU 56 reads a process recipe corresponding to the input process type, from the recipe storing unit 52 (step S3). In the process recipe, for example, as illustrated in FIG. 7, a process condition (e.g., a temperature in the reaction tube 2) is stored for every area.

Next, the CPU 56 causes the boat elevator 7 (cover 6) to be moved down so that the wafer boat 9 equipped with at least one semiconductor wafer W (monitor wafer) in each ZONE is disposed on the cover 6. Subsequently, the CPU 56 causes the boat elevator 7 (cover 6) to be moved up so that the wafer boat 9 (the semiconductor wafer W) is loaded into the reaction tube 2. Then, the CPU 56 controls the pressure adjusting unit 5, the power controllers 16 to 20 of the heaters 11 to 15, and the flow rate controlling units 24 to 26 along the recipe to form a SiO$_2$ film on the semiconductor wafer W (step S4).

When the film formation processing is completed, the CPU 56 measures the film thickness of the formed SiO$_2$ film (step S5). For example, the CPU 56 causes the boat elevator 7 (cover 6) to be moved down so that the semiconductor wafer W formed with the SiO$_2$ film is unloaded, and the semiconductor wafer W is conveyed to, for example, a measurement device (not illustrated), thereby measuring the film thickness of the SiO$_2$ film formed on the semiconductor wafer W. In the measurement device, when the film thickness of the SiO$_2$ film formed on the semiconductor wafer W is measured, the measured film thickness data of the SiO$_2$ film is transmitted to the heat treatment apparatus (CPU 56). When the measured film thickness data of the SiO$_2$ film is received, the CPU 56 specifies the film thickness of the formed SiO$_2$ film. Alternatively, the operator may operate the operation panel 58 to input the measurement data.

When the film thickness of the formed SiO$_2$ film is measured, the CPU 56 determines whether the measured film thickness falls within an allowable range (step S6). The term "within an allowable range" means that it is included within a predetermined allowable range from the input target film thickness, for example, within ±1% from the input target film thickness.

When it is determined that the measured film thickness does not fall within the allowable range (step S6; No), the CPU 56 calculates a temperature set value in accord with the target film thickness (step S7). For example, as illustrated in FIG. 8, the CPU 56 calculates a set temperature of each of the heaters 11 to 15 disposed in each zone (ZONES 1 to 5) in the reaction tube 2 where the target film thickness is formed, based on the calculated temperature set value and the film thickness change model stored in the model storing unit 51. Then, the CPU 56 updates the temperature of each zone of the read recipe with the calculated set temperature (step S8). Then, the CPU 56 returns to step S4, and forms a SiO$_2$ film on the semiconductor wafer W.

When it is determined that the measured film thickness falls within the allowable range (step S6; Yes), the CPU 56 terminates the processing.

Next, in order to confirm the effects of the present disclosure, a film formation was performed such that the surface of the semiconductor wafer W in each zone is formed in a shallow in-plane concave shape by the heat treatment of the present disclosure. FIG. 9A illustrates a film thickness formed on the semiconductor wafer W in each zone before adjustment, and FIG. 9B illustrates a film thickness formed on the semiconductor wafer W in each zone after adjustment. As illustrated in FIGS. 9A and 9B, it was confirmed that a film formation was performed on the semiconductor wafer W in every zone such that the surface is formed in an in-plane concave shape.

As described above, according to the present exemplary embodiment, the in-plane shape of the semiconductor wafer W may be easily controlled by an operator who merely inputs a target film thickness.

Further, the present disclosure is not limited to the above-described exemplary embodiment, and various modifications and applications may be made thereto. Hereinafter, descriptions will be made on other exemplary embodiments that are applicable to the present disclosure.

In the above-described exemplary embodiment, the present disclosure was described with respect to the case where a target film thickness of the center of the $SiO_2$ film to be formed and a target film thickness of the edge thereof were input for every zone, as illustrated in FIG. 5. For example, however, a target film thickness, a target shape (e.g., concave, a convex, or flat), and an in-plane uniformity, as illustrated in FIGS. 10A and 10B, or a target film thickness, a target shape, and an in-plane range, as illustrated in FIG. 10C, may be input for every zone.

Figure 11:
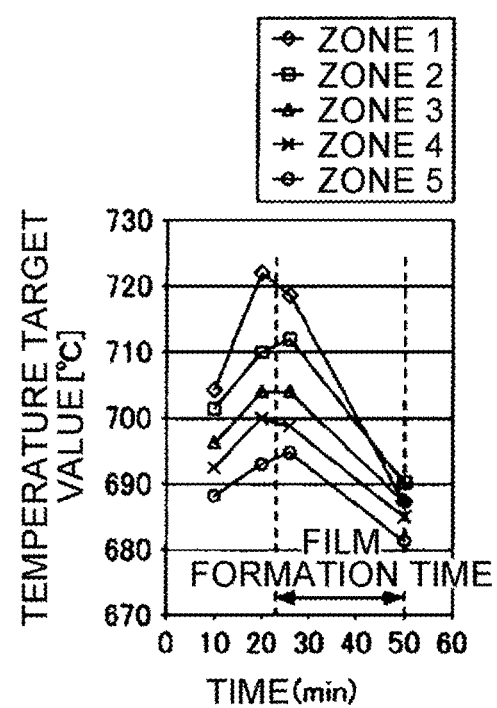
FIG. 11 is a view illustrating a film forming temperature in each zone in a film forming processing.
Figure 12A:
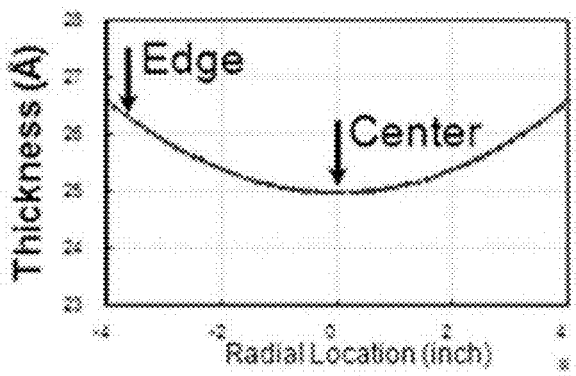
FIG. 12A is a view illustrating a film thickness of a thin film formed on a semiconductor wafer when the film forming temperature in the film forming processing is constant.

In the above-described exemplary embodiment, the present disclosure was described with respect to the case where the film formation temperature in the film formation processing was constant. For example, however, as illustrated in FIG. 11, the film formation temperature may be gradually reduced (decreased) in each zone. In this regard, the degree of the temperature change for the set temperature is different between the center portion and the edge portion of the semiconductor W. For example, since the edge portion of the semiconductor wafer W is closer to the outside of the semiconductor wafer W (heater unit 10), the edge portion tends to be easily heated or cooled. On the other hand, since the center portion of the semiconductor wafer W is far from the outside of the semiconductor wafer W (heater unit 10), the center portion tends to be hardly heated or cooled. Thus, the film thickness of the thin film formed on the semiconductor wafer W is easily formed in a concave shape of which the center portion is thin, as illustrated in FIG. 12A.

Figure 12B:
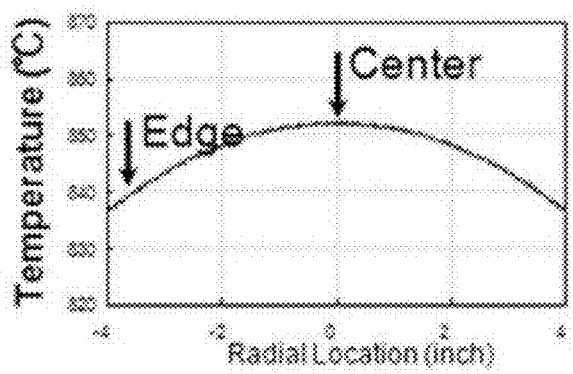
FIG. 12B is a view illustrating an in-plane temperature of the semiconductor wafer when the set temperature is decreased with the lapse of time.
Figure 12C:
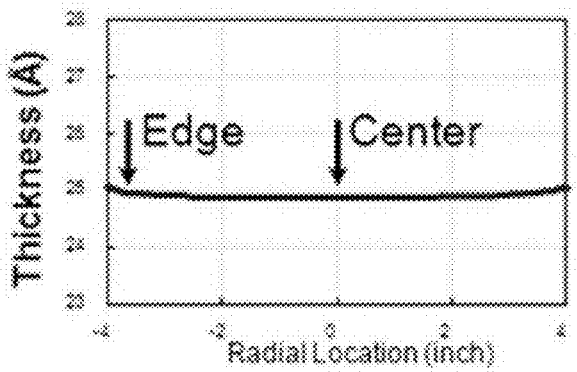
FIG. 12C is a view illustrating a film thickness of the thin film formed on the semiconductor wafer when the set temperature is decreased with the lapse of time.

Here, as illustrated in FIG. 11, when the set temperature is decreased with the lapse of time, the temperature in the vicinity of the edge portion of the semiconductor wafer W is decreased earlier than the vicinity of the center portion. As a result, the temperature of the center portion of the semiconductor wafer W is relatively higher than the temperature of the edge portion, as illustrated in FIG. 12B. When the film formation is performed while gradually reducing (decreasing) the film formation temperature in the film formation processing in each zone by the change of the in-plane temperature of the semiconductor wafer W, as illustrated in FIG. 12C, the concave shape of the film thickness distribution illustrated in FIG. 12A may be moderated, resulting in a flatter film thickness distribution. As a result, the in-plane uniformity of the film thickness of the semiconductor wafers W is enhanced.

For example, the model storing unit 51 stores a model representing a relationship between recipes of the case where the film formation temperature in the film formation processing is constant and the case where the film formation temperature is gradually reduced (decreased), and a change in film thickness of a $SiO_2$ film to be formed. Accordingly, when it is determined that the film thickness distribution measured in the measurement of step S6 is in a concave shape and does not fall within the allowable range, it is possible to calculate a temperature set value that gradually reduces (decreases) the film formation temperature in the film formation processing, in the temperature set value calculation of step S7.

Further, by storing a plurality of models representing a relationship between a recipe of the case where the film formation temperature is gradually reduced (decreased), and a change in film thickness of a $SiO_2$ film to be formed, the CPU 56 is able to improve the accuracy of the temperature to be decreased (calculate the optimum temperature).

In the above-described exemplary embodiment, the present disclosure was described with respect to the case where the $SiO_2$ film is formed using dichlorosilane and dinitrogen monoxide. For example, however, the present disclosure may also be applied to a formation of the $SiO_2$ film using dichlorosilane and ammonia ($NH_3$).

In the above-described exemplary embodiment, the present disclosure was described with respect to the case where the $SiO_2$ film is formed. However, the kind of the processing is arbitrary, and the present disclosure is applicable to various batch type heat treatment apparatuses for forming other kinds of films such as, for example, a chemical vapor deposition (CVD) apparatus and an oxidation apparatus.

In the above-described exemplary embodiment, the present disclosure was described with respect to the case where the number of tiers of the heaters (the number of zones) is five. However, the number of tiers may be four or less, or six or more. Further, the number of semiconductor wafers W extracted from each zone may be arbitrarily set.

In the above-described exemplary embodiment, the present disclosure was described with respect to the case of the batch type heat treatment apparatus having a single tube structure. However, the present disclosure may also be applied to a batch type vertical heat treatment apparatus having a double tube structure in which the reaction tube 2 is constituted by an inner tube and an outer tube. Further, the present disclosure is not limited to the processing of semiconductor wafers, but is also applicable to a processing of, for example, FPD substrates, glass substrates, or PDP substrates.

The controller 50 related to the exemplary embodiment of the present invention may be realized using a general computer system without a dedicated system. For example, the controller 50, which executes the processing described above, may be constituted by installing a program for executing the processing described above from a storage medium (e.g., a flexible disc or a compact disc read only memory (CD-ROM)) storing the program to a general purpose computer.

And, the means to supply the program is arbitrary. The program may be supplied via, for example, a communication line, a communication network, or a communication system, besides the predetermined storage medium as described above. In this case, the program is uploaded on, for example, a bulletin board system (BBS) of a communication network, and provided in superposition on a carrier wave via a network. Then, the thus-provided program is started and executed similarly to other application programs under a control of an operating system (OS), so that the above-described processing is performed.

The present disclosure is useful for a heat treatment system for performing a heat treatment on a workpiece such as, for example, a semiconductor wafer.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A heat treatment system comprising:
a heater configured to heat an inside of a processing chamber in which a workpiece is accommodated; and
a controller that performs an overall control of the heat treatment system,
wherein the controller is configured to:
store a recipe according to heat treatment content, including a temperature in the processing chamber heated by the heater;
store a heat treatment change model that represents a relationship between a change of a temperature in the processing chamber and a corresponding change in film thickness resulting from the change of the temperature;
calculate a film thickness by converting inputted target information with respect to an in-plane shape of a film to be formed on the workpiece, prior to forming the film on the workpiece and prior to receiving a measured film thickness;
form the film on the workpiece by reading the stored recipe;
receive the measured film thickness of the film formed on the workpiece; and
calculate an optimum temperature that results in the inputted target information, based on the stored heat treatment change model when the measured film thickness does not fall within an allowable range relative to the inputted target information.

2. The heat treatment system of claim 1, wherein the processing chamber is divided into a plurality of zones, each including at least a workpiece,
the heater is configured to set a temperature for each of the zones in the processing chamber,
the controller is further configured to:
store a recipe for each of the zones in the processing chamber;
store a heat treatment change model that represents a relationship between a change of a temperature in the processing chamber for each of the zones and a change of a corresponding film thickness resulting from the change of the temperature for each of the zones;
calculate a film thickness for each zone by converting inputted target information with respect to an in-plane shape of a film to be formed on the workpiece for each zone; and
calculate an optimum temperature for each of the zones that results in the inputted target information based on the stored heat treatment change model when measured thicknesses do not fall within an allowable range relative to the inputted target information for each zone.

3. The heat treatment system of claim 1, wherein the heat treatment content is a film formation processing.

4. The heat treatment system of claim 3, wherein the inputted target information with respect to the in-plane shape of the film to be formed on the workpiece includes a thickness of a center of the film to be formed on the workpiece and a thickness of an edge of the film to be formed on the workpiece.

5. The heat treatment system of claim 3, wherein the inputted target information with respect to the in-plane shape of the film to be formed on the workpiece includes a thickness of the film to be formed on the workpiece, a shape of the film to be formed on the workpiece, and an in-plane uniformity of the film to be formed on the workpiece.

6. The heat treatment system of claim 3, wherein the inputted target information with respect to the in-plane shape of the film to be formed on the workpiece includes a thickness of the film to be formed on the workpiece, a shape of the film to be formed on the workpiece, and an in-plane range of the film to be formed on the workpiece.

7. The heat treatment system of claim 5, wherein the shape of the film includes a convex, a concave, or a flat shape.

8. The heat treatment system of claim 6, wherein the shape of the film includes a convex, a concave, or a flat shape.

9. A heat treatment method by using the heat treatment system of claim 1.

10. A non-transitory computer-readable storage medium that stores a program which, when executed, causes a computer to control the heat treatment method of claim 5.

* * * * *